July 4, 1967 A. J. TAVENDALE 3,329,538
METHOD FOR THE PRODUCTION OF SEMICONDUCTOR LITHIUM-ION DRIFT DIODES
Filed Nov. 27, 1964
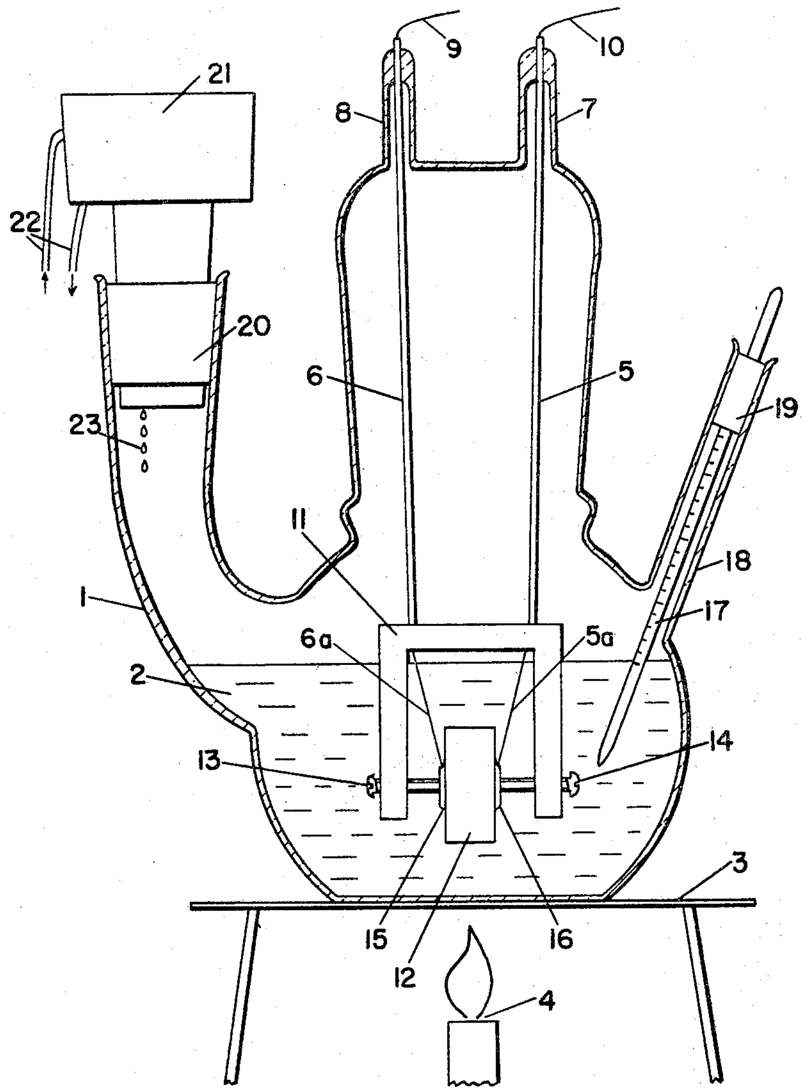
INVENTOR
ALISTER J. TAVENDALE
By J. R. Hughes
PATENT AGENT United States Patent Office
3,329,538
Patented July 4, 1967

3,329,538
METHOD FOR THE PRODUCTION OF SEMICONDUCTOR LITHIUM-ION DRIFT DIODES

Alister J. Tavendale, Deep River, Ontario, Canada, assignor to Atomic Energy of Canada, Limited, Ottawa, Ontario, Canada, a corporation of Canada
Filed Nov. 27, 1964, Ser. No. 414,229
2 Claims. (Cl. 148—188)

This invention relates to a method and apparatus for the production of semiconductor lithium-ion drift diodes.

A method of forming a wide intrinsic layer in a semiconductor body of either the P or N type by lithium-ion drift techniques has been described in U.S. Patent No. 3,016,313 dated Jan. 9, 1963, to E. M. Pell. In this patent it has been shown that lithium (a donor) can be drift into P-type silicon by applying at a temperature between 100° C. and 150° C., to a N-P junction consisting of lithium-diffused N region formed on a crystal of P-type silicon and that the lithium will exactly compensate for the acceptors in the silicon. This results in the formation of an intrinsic region of high resistivity which grows from the N-type layer into and across the silicon crystal. It has also been shown that the lithium-drifting technique could also be applied to other semiconductor materials especially germanium.

The lithium-drifted diode (P.I.N. detector) is expected to have very wide use as a photoelectric and gamma-ray spectrometer. As the sensitivity and resolution of these devices are dependent on the active volume of the intrinsic region, it is most desirable that the region or layer be as wide as possible. A difficulty encountered with the present methods of drifting is the long time required to produce a compensated (intrinsic) layer of only a few millimeters thickness.

It is an object of the present invention to provide a method of producing lithium-drifted germanium semiconductor diodes wherein a very wide intrinsic layer is produced in a much shorter time than by known methods.

This and other objects of the invention are achieved by applying a layer of lithium to one face of a slab-shaped crystal of germanium to form a P-N junction, heating the crystal in a boiling liquid having a boiling point in the range of 50° C. to 70° C., and applying a voltage bias across the P-N junction such that lithium ions drift into the germanium to form a wide intrinsic layer.

In drawings which illustrate an embodiment of the invention,

FIGURE 1 is a cross-section of the apparatus used to form the intrinsic region in the crystal.

Referring to FIGURE 1, a flask 1 is mounted on a stand 3 and heated by a suitable source of heat 4. The flask is partially filled with chloroform 2 which is brought to its boiling point by the heat source. One arm of the flask is connected by any suitable connector means 20 to a condenser 21 open to atmospheric pressure having coolant lines 22. The chloroform vapour is condensed and the condensate 23 returns to the flask. A thermometer 17 is positioned in another arm 18 of the flask by means of plug 19 so as to indicate the temperature of the liquid in the flask.

A slab-shaped crystal 12 of germanium is clamped between contact-making plates 15 and 16 by means of nylon screws 13 and 14 threaded into the arms of Teflon yoke

11. Yoke 11 is positioned in the flask by means of metal rods 5 and 6 which extend through the upper end of the flask via glass seals 7 and 8. Rods 5 and 6 which act as electrical conductors as well as positioning means are connected externally to electrical leads 9 and 10 which would be connected to a source of DC voltage. Electrical connection is made from rods 5 and 6 to contacts 15 and 16 by means of nickel wires 5A and 6A.

To produce a lithium-drifted P.I.N. diode using this apparatus, a block of semiconductor material (e.g. germanium) of suitable size to cut from a crystal. A thin layer of lithium is coated on one surface of the block by any suitable means, for example by evaporation. The germanium and the lithium form a P-N junction by alloying the lithium and germanium at 400° C. for 2 minutes in vacuo. The faces of the block are then covered with a thin nickel coating to provide electrical contacts. The block is then clamped in the apparatus, as described above, and heat is applied to the flask. The chloroform boils at approximately 61° C. The block of semiconductor material is maintained at this temperature due to the boiling action of the chloroform at its surface. A DC voltage is applied to leads 9 and 10 which results in an electrical field being set up across the crystal from the lithium surface, across the junction, to the opposite surface. Under the conditions of elevated temperature and voltage bias across the P-N junction, ions of lithium migrate or drift across the junction into the germanium. Here they tend to compensate for or neutralize the acceptor (P-type) property of the germanium. This results in a layer of germanium having an intrinsic characteristic being formed first adjacent the junction and then building up as a slowly moving front across the block of crystal.

The speed of drift of the lithium in germanium is quite slow when carried out by presently known means e.g. heating in air and controlling the temperature by metal heat sinks clamped to the crystal and it takes up to a month to produce an intrinsic layer of only 2 or 3 mm. thickness for large crystals, e.g. 8 sq. cm. area x 1 cm. depth. For lithium-drifting in germanium the best temperature to operate at is in the range 50° C. to 70° C. The voltage bias applied should be high, but this is limited by the amount of power than can be absorbed without undue heating effects in the block of crystal. The boiling liquid system has been found to be the best for this purpose. In an actual experimental drifting process using a slab of germanium of 8 sq. cm. area x 1 cm. depth, it was found that at least 60 watts of power could be accommodated by the system which allowed the application of a DC bias of the order of 200 volts.

By using the above drifting process it has been found that the drifting speed can be increased considerably. In actual tests, intrinsic layers of 5 mm. thickness have been produced in ten days. It is expected that layers of 8 to 10 mms. can be produced and in comparable times.

The lithium coating which when applied is in the order of 500 microns in thickness becomes progressively poorer as a source of lithium ions as the process proceeds and the rate of drift decreases because of a necessary lowering of applied bias in order to reduce thermal effects. If the drift process is temporarily interrupted and the coated surface is pared or cutback with a fresh layer of lithium applied, the drifting action is enhanced. It is obvious that this cutting back which might remove a layer up to ½ mm. in thickness, reduces the effective width of the intrinsic layer each time it is carried out. It has been found, however, that this cutting back procedure can be carried out 3 or 4 times to good effect in the overall procedure.

What is claimed is:

1. A method of producing lithium-drifted germanium diodes comprising applying a thin layer of lithium to one face of a slab of germanium crystal of P-type conductivity to form a P-N junction, heating the crystal in boiling chloroform having a boiling point of approximately 61° C., and applying a DC voltage across the P-N junction such that lithium ions will drift into the germanium to form a wide intrinsic layer.

2. A method of producing lithium-drifted germanium diodes as in claim 1 wherein the drifting action is enhanced by temporarily stopping the process at intervals, cutting off a thin layer of the crystal at the lithium coated face, and applying a fresh layer of lithium.

References Cited

UNITED STATES PATENTS

| | | | |
|---|---|---|---|
| 3,016,313 | 1/1962 | Pell | 148—188 |
| 3,212,940 | 10/1965 | Blankenship | 148—188 |
| 3,212,943 | 10/1965 | Freck | 148—188 |

HYLAND BIZOT, *Primary Examiner.*